(12) United States Patent
Wang et al.

(10) Patent No.: US 11,610,519 B2
(45) Date of Patent: Mar. 21, 2023

(54) FLEXIBLE SUBSTRATE AND MANUFACTURING METHOD THEREOF, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Wei Wang, Beijing (CN); Zhifeng Zhan, Beijing (CN); Yanxin Wang, Beijing (CN); Shuquan Yang, Beijing (CN); Jiafan Shi, Beijing (CN); Zhongyuan Sun, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 322 days.

(21) Appl. No.: 16/632,710

(22) PCT Filed: Jul. 9, 2019

(86) PCT No.: PCT/CN2019/095184
§ 371 (c)(1),
(2) Date: Jan. 21, 2020

(87) PCT Pub. No.: WO2020/019973
PCT Pub. Date: Jan. 30, 2020

(65) Prior Publication Data
US 2021/0264820 A1 Aug. 26, 2021

(30) Foreign Application Priority Data
Jul. 24, 2018 (CN) .......................... 201810819688.4

(51) Int. Cl.
*G09F 9/30* (2006.01)
*B32B 27/08* (2006.01)
(Continued)

(52) U.S. Cl.
CPC ................ *G09F 9/301* (2013.01); *B32B 3/30* (2013.01); *B32B 27/08* (2013.01); *B32B 37/12* (2013.01);
(Continued)

(58) Field of Classification Search
CPC ......... G09F 9/301; B32B 27/08; B32B 37/12; B32B 2037/1253; B32B 2307/51;
(Continued)

(56) References Cited

U.S. PATENT DOCUMENTS 3,225,768 A * 12/1965 Galitzki ................ A41C 3/0014
450/39
2015/0049428 A1* 2/2015 Lee ........................ G06F 1/1641
361/679.27

(Continued)

FOREIGN PATENT DOCUMENTS

CN 105702624 A 6/2016
CN 106783917 A 5/2017
(Continued)

*Primary Examiner* — John D Freeman
(74) *Attorney, Agent, or Firm* — Dilworth & Barrese, LLP.; Michael J. Musella, Esq.

(57) ABSTRACT

A flexible substrate and a manufacturing method thereof and a display device are provided. The flexible substrate has a bending region. The flexible substrate includes a base substrate, and a first organic layer and a second organic layer which are sequentially laminated on the base substrate, and a surface where the first organic layer contacts the second organic layer in the bending region includes a concave-convex structure.

20 Claims, 11 Drawing Sheets

(51) Int. Cl.
  *B32B 37/12* (2006.01)
  *B32B 3/30* (2006.01)
  *H01L 27/32* (2006.01)
  *H01L 51/00* (2006.01)

(52) U.S. Cl.
  CPC ...... *H01L 27/3246* (2013.01); *H01L 51/0097*
    (2013.01); *B32B 2037/1253* (2013.01); *B32B
    2307/51* (2013.01); *B32B 2457/206* (2013.01);
    *H01L 2251/5338* (2013.01)

(58) Field of Classification Search
  CPC ... B32B 2457/206; B32B 3/30; B32B 27/285;
    B32B 2457/202; B32B 3/266; B32B
    27/281; B32B 27/286; B32B 27/308;
    B32B 27/32; B32B 27/36; B32B 27/365;
    B32B 27/38; B32B 2255/10; B32B
    2255/26; H01L 27/3258; H01L
    2251/5338; H01L 51/0097; H01L
    27/3244; H01L 27/3246; H01L 51/5253;
    H01L 51/56; Y02E 10/549; Y02P 70/50
  See application file for complete search history.

(56) References Cited

U.S. PATENT DOCUMENTS

| | | | |
|---|---|---|---|
| 2017/0077447 A1* | 3/2017 | Kang | .................. H01L 27/3276 |
| 2018/0104915 A1 | 4/2018 | Liu | |
| 2018/0182829 A1 | 6/2018 | Shin et al. | |
| 2018/0197935 A1* | 7/2018 | Yuan | .................. H01L 51/0097 |
| 2019/0156708 A1 | 5/2019 | Li et al. | |

FOREIGN PATENT DOCUMENTS

| | | |
|---|---|---|
| CN | 207116427 U | 3/2018 |
| CN | 109461830 A | 3/2019 |
| KR | 20180073352 A | 7/2018 |

* cited by examiner

FLEXIBLE SUBSTRATE AND MANUFACTURING METHOD THEREOF, AND DISPLAY DEVICE

This application claims the benefit of Chinese patent application No. 201810819688.4 filed on Jul. 24, 2018, which is hereby entirely incorporated by reference as a part of the present application.

TECHNICAL FIELD

Embodiments of the present disclosure relate to a flexible substrate, a manufacturing method of the flexible substrate, and a display device.

BACKGROUND

With a development of flexible electronic technology, flexible electronic devices with foldability are gradually favored. For example, in order to realize narrow-bezel display or even borderless display of a display device, a non-display region of the display device may be bent; or for the convenience of carrying, the electronic device may be bent. Performances of the flexible electronic devices are closely related to manufacturing process technologies. How to improve the flexible electronic process technology is a focus in this field.

SUMMARY

The embodiments of the present disclosure provide a flexible substrate which includes a bending region, the flexible substrate includes a base substrate and a first organic layer and a second organic layer which are sequentially laminated on the base substrate; and in the bending region, a surface of the first organic layer where the first organic layer contacts the second organic layer includes a concave-convex structure.

For example, the concave-convex structure includes at least one concave structure, and the second organic layer includes a first portion filled into the at least one concave structure and a second portion outside the at least one concave structure.

For example, the concave-convex structure has a higher distribution density, a larger planar area or a larger cross section area at a position corresponding to an edge of the second organic layer than at a position corresponding to a center of the second organic layer.

For example, the concave-convex structure includes a plurality of the concave structures, the plurality of the concave structures are arranged in a plurality of rows, and an extension direction of each of the plurality of rows is parallel to a bending axis of the bending region.

For example, a planar shape of each concave structure is a strip, an extension direction of the strip is parallel to the bending axis, and a width of the strip gradually decreases from a position corresponding to an edge of the second organic layer to a position corresponding to a center of the second organic layer.

For example, a cross-sectional shape of the concave structure in a direction perpendicular to the base substrate includes at least one selected from the group consisting of a rectangle, a trapezoid, a semicircle and an oval; a planar shape of the concave structure in a direction parallel to the base substrate includes at least one selected from the group consisting of a circle, a triangle, a rectangle, an oval, a T-shape, a strip shape, a polyline shape and a mesh shape.

For example, the concave-convex structure includes a plurality of the concave structures, and each concave structure is strip-shaped, and the plurality of the concave structures intersect to form a mesh structure.

For example, the flexible substrate further includes an insulating layer between the base substrate and the first organic layer, and the insulating layer includes an opening corresponding to the bending region and being configured to be bent, and the first organic layer covers the insulating layer and fills the opening.

For example, the second organic layer extends outside the bending region, and the concave-convex structure is further provided at a surface where the first organic layer contacts the second organic layer outside the bending region.

For example, the first organic layer includes a planarization layer.

For example, the first organic layer further includes a pixel defining layer and/or a spacer layer, and the pixel defining layer and/or the spacer layer are/is on the planarization layer and include/includes a plurality of portions spaced apart from each other to form the concave-convex structure.

For example, the second organic layer is filled into spacing regions in the pixel defining layer and/or the spacer layer, and is in contact with a surface of the planarization layer.

For example, the second organic layer is a UV-curable material.

For example, a material of the first organic layer is at least one selected from the group consisting of polymethyl methacrylate, polycarbonate, polystyrene, epoxy resin, polyimide and polyethylene.

For example, the flexible substrate further includes a display region and a bonding region outside the display region, and the bending region is between the display region and the bonding region.

The embodiments of the present disclosure further provide a display device, which includes the flexible substrate according to any one of the above embodiments.

The embodiments of the present disclosure further provide a manufacturing method of the flexible substrate according to any one of the above embodiments, and the manufacturing method includes: forming the first organic layer on the base substrate, and processing a surface which is included by the first organic layer and is corresponding to the bending region to form the concave-convex structure, and forming the second organic layer in the bending region.

For example, the forming the second organic layer includes: forming an organic solution layer on the first organic layer, and curing the organic solution layer to form the second organic layer.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
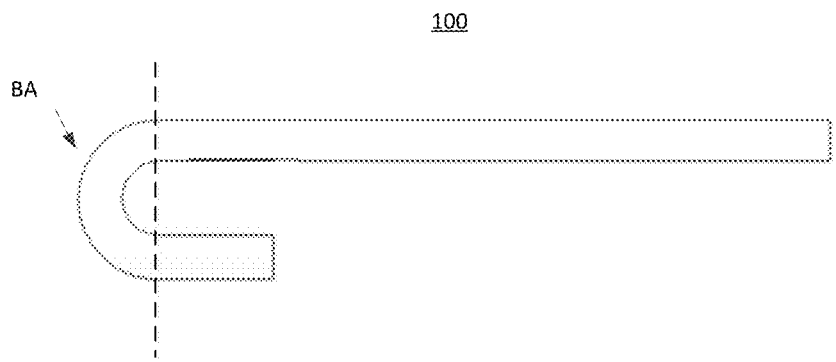
FIG. 1 is a schematic structural view of a flexible substrate according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A flexible electronic device includes a flexible substrate and various circuit structures and electronic devices and the like formed on the flexible substrate. According to requirements, some portions (such as a bonding region, etc.) of the flexible electronic device may be folded and fixed, or may be bent during use to adjust a positional relationship between different portions (such as in a multi-screen mobile phone). A portion which is bent of the flexible electronic device is referred to as a bending region. In the bending region of the flexible electronic device, an organic protective layer is usually formed on the outside to protect the device. Due to a bending stress, the organic protective layer is prone to break and fall off, thereby causing a risk that device structures in the bending region generate defects.

The embodiments of the present disclosure provide a flexible substrate having a bending region. The flexible substrate includes a base substrate, and a first organic layer and a second organic layer which are sequentially laminated on the base substrate; in the bending region, a surface of the first organic layer for contacting the second organic layer includes a concave-convex structure.

The embodiments of the present disclosure increase a contact area between the second organic layer and the first organic layer by providing the concavo-convex structure at the surface of the first organic layer where the first organic layer contacts the second organic layer, thereby releasing an internal stress which is easy to cause fracture in the second organic layer, improving an adhesion force of the second organic layer to the surface of the first organic layer, and thereby reducing or eliminating the risk that the second organic layer falls off.

The flexible substrate will be described below through several embodiments.

FIG. 1 is a schematic structural view of the flexible substrate provided by the embodiments of the present disclosure. As shown in the figure, the flexible substrate 100 includes a bending region BA. For example, the flexible substrate is used in a display panel such as an organic light-emitting diode display panel or a liquid crystal display panel. For example, the bending region BA is disposed in a non-display region of the flexible substrate, and can be bent to fold an edge portion of the flexible substrate to the back of an effective working portion (for example, a display region), thereby realizing a narrow-bezel display panel.

Figure 2:
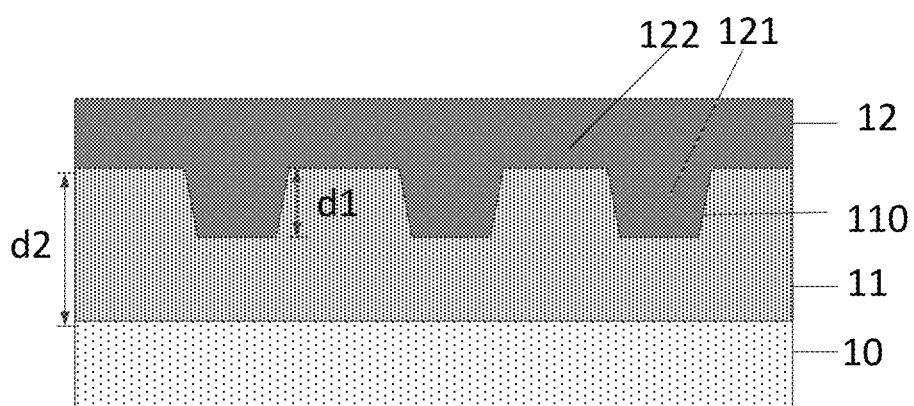
FIG. 2 is an enlarged cross-sectional view of a bending region of the flexible substrate in FIG. 1.

FIG. 2 is an enlarged cross-sectional view showing the bending region of the flexible substrate in FIG. 1 in a flat state before being bent. As shown in the figure, the flexible substrate 100 includes a base substrate 10 and a first organic layer 11 and a second organic layer 12 which are sequentially laminated on the base substrate 10. In the bending region BA, a surface where the first organic layer 11 contacts the second organic layer 12 has a concave-convex structure, that is, the surface where the first organic layer 11 and the second organic layer 12 are in contact is concave or convex in the bending region BA. For example, the second organic layer 12 is configured to provide protection to the first organic layer 11, and particularly to provide protection to the first organic layer 11 after the bending region is bent.

For example, the concave-convex structure formed at the contact surface between the first organic layer 11 and the second organic layer 12 includes at least one concave structure 110, and the second organic layer 12 includes a first portion 121 filled in the concave structure 110 and a second portion 122 located outside the concave portion 110.

It should be noted that the concave-convex structure refers to a structure provided according to needs, and is different from an uneven state which cannot be avoided in a conventional manufacturing method. The concave-convex structure may include a structure that is recessed with respect to a reference plane of the first organic layer 11 (a surface of the first organic layer at a flat portion or a plane where the base substrate is located), and include a structure that is raised with respect to the reference plane; or, the concave-convex structure may include a combination pattern of a concave structure and a convex structure. Because a concave state and a convex state are relative, for convenience of description, the embodiments of the present disclosure collectively refer to the concave structure and the convex structure as a "concave structure", that is, the "concave structure" in the embodiments of the present disclosure includes the structure that is recessed with respect to the reference plane of the first organic layer 11 and the structure that is convex with respect to the reference plane of the first organic layer 11.

Figure 3A:
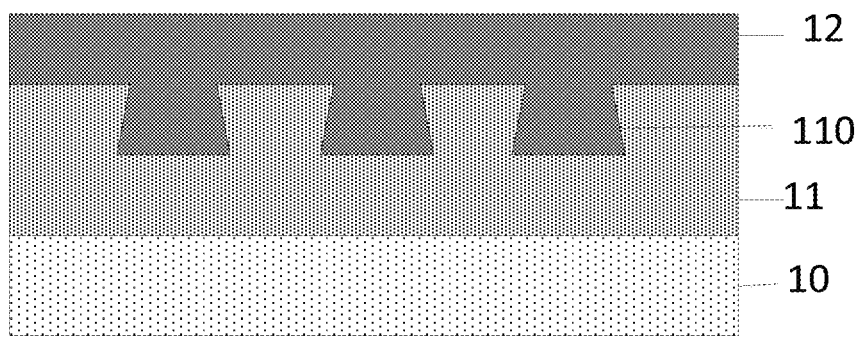
FIGS. 3A-3R illustrate several examples of the flexible substrate provided by the embodiments of the present disclosure.
Figure 3B:
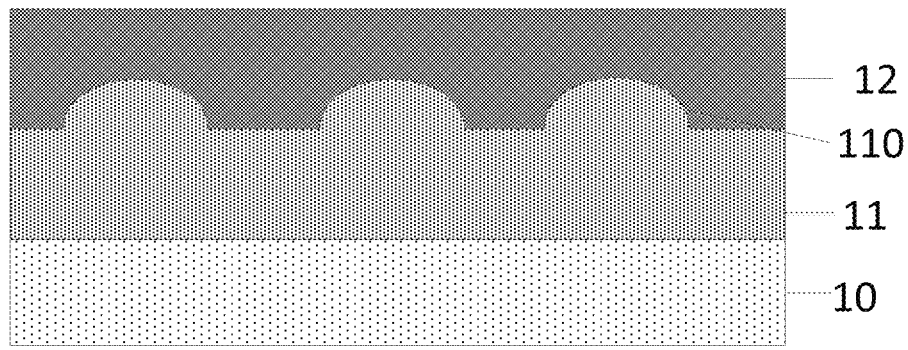
Figure 3C:
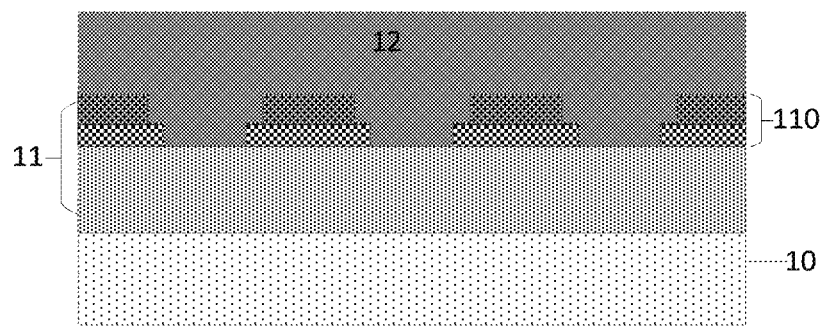
Figure 3D:
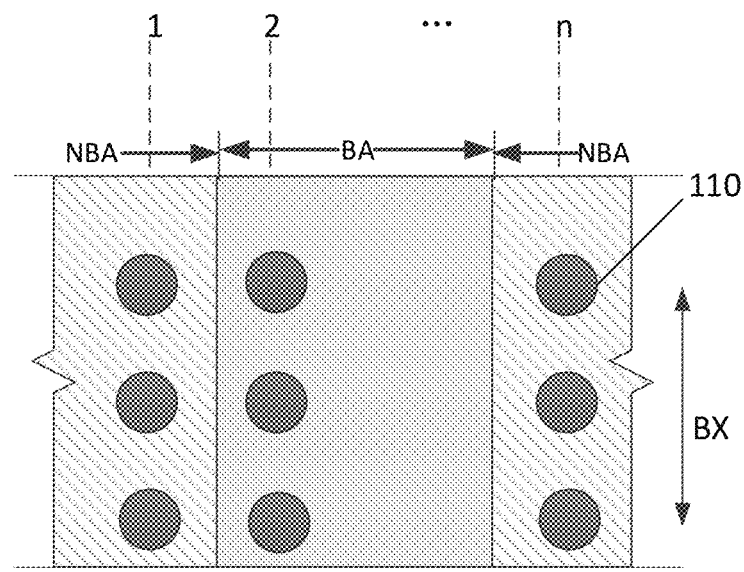
Figure 3E:
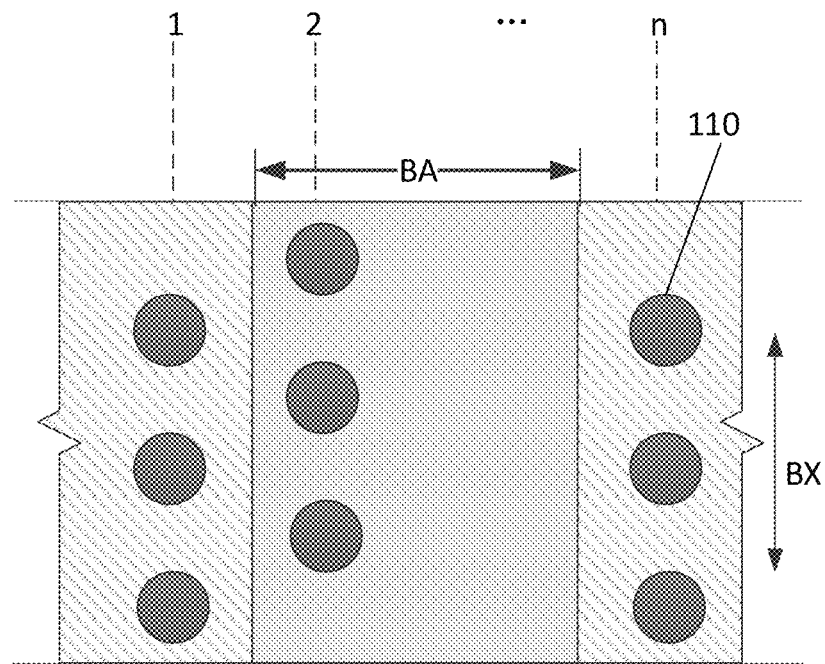
Figure 3F:
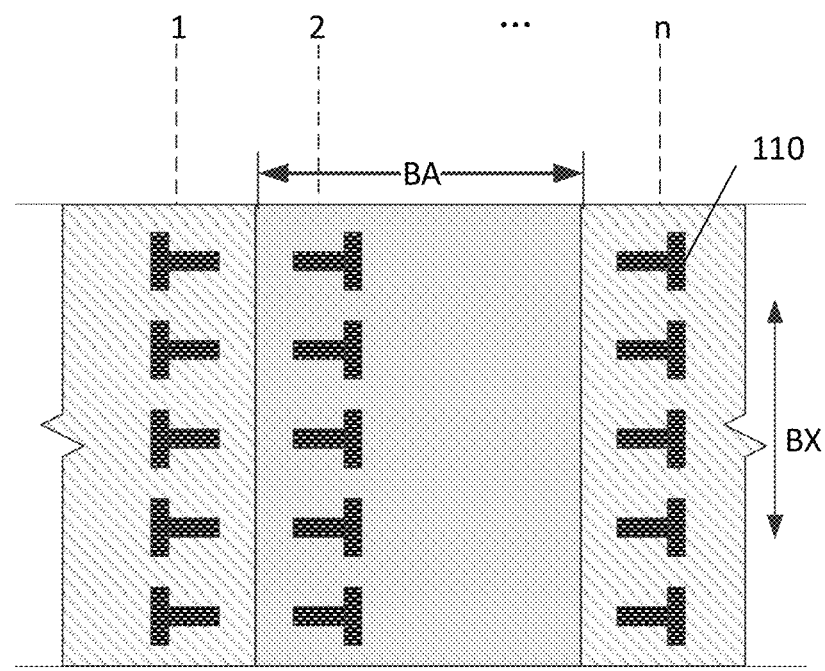
Figure 3G:
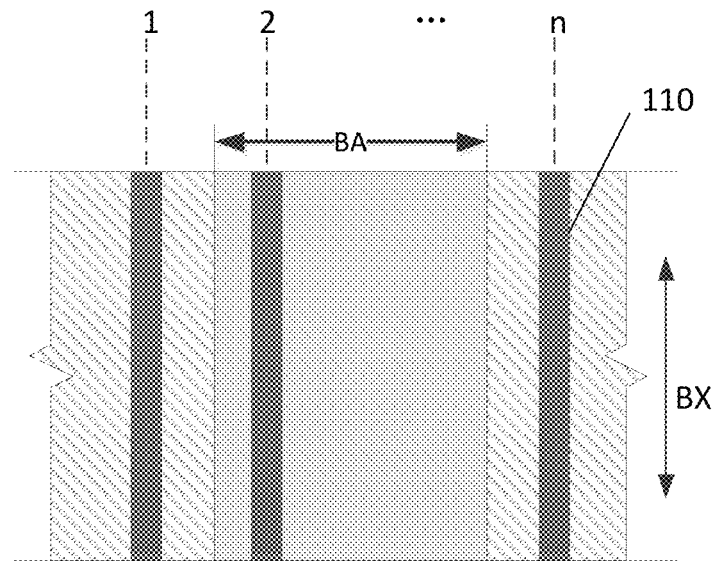
Figure 3H:
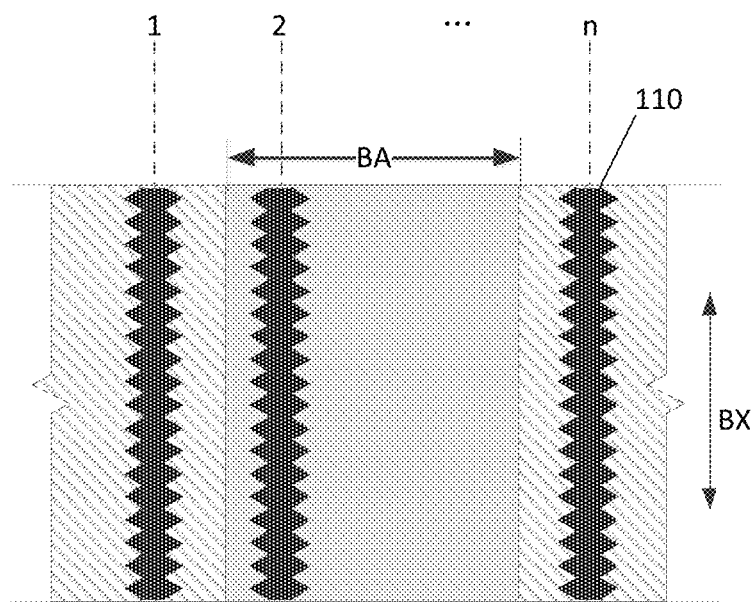
Figure 3I:
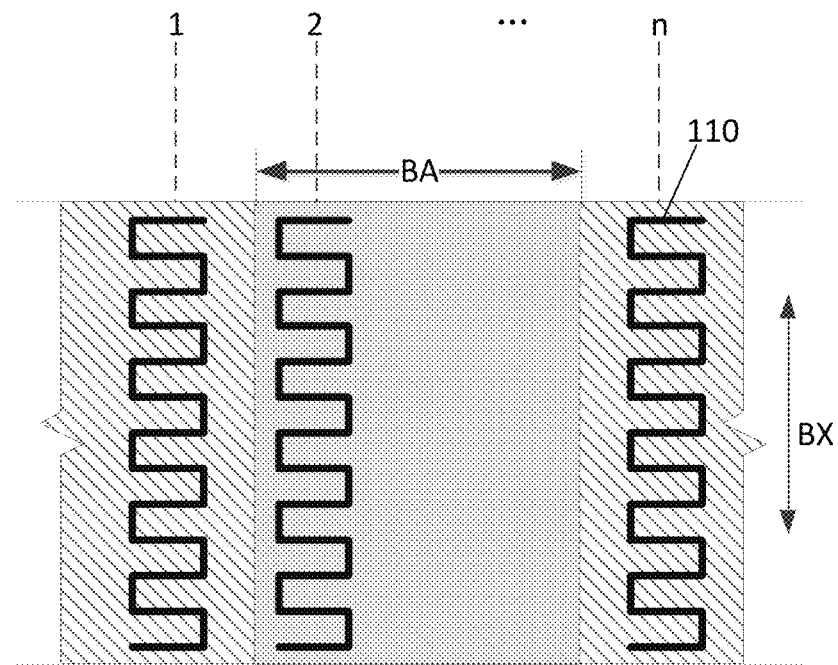
Figure 3J:
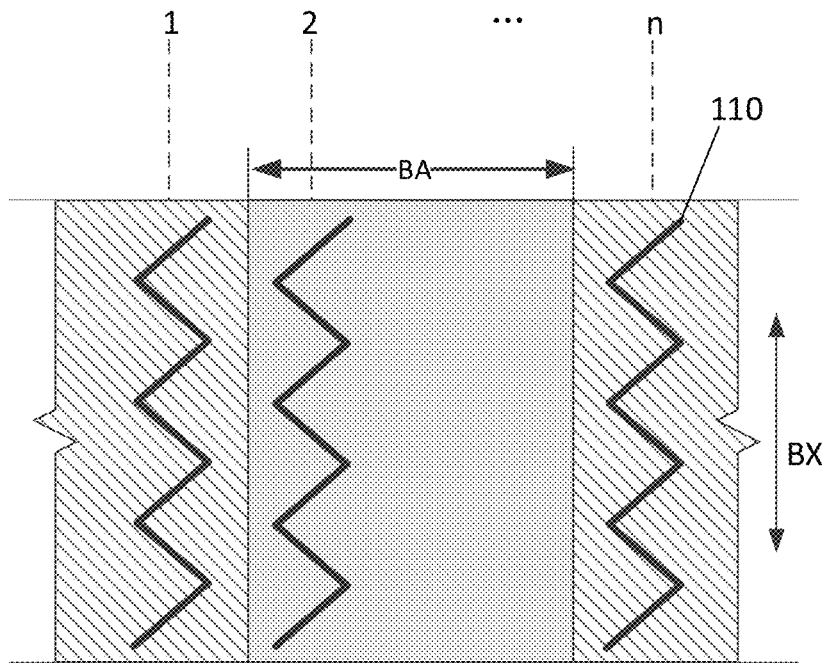
Figure 3K:
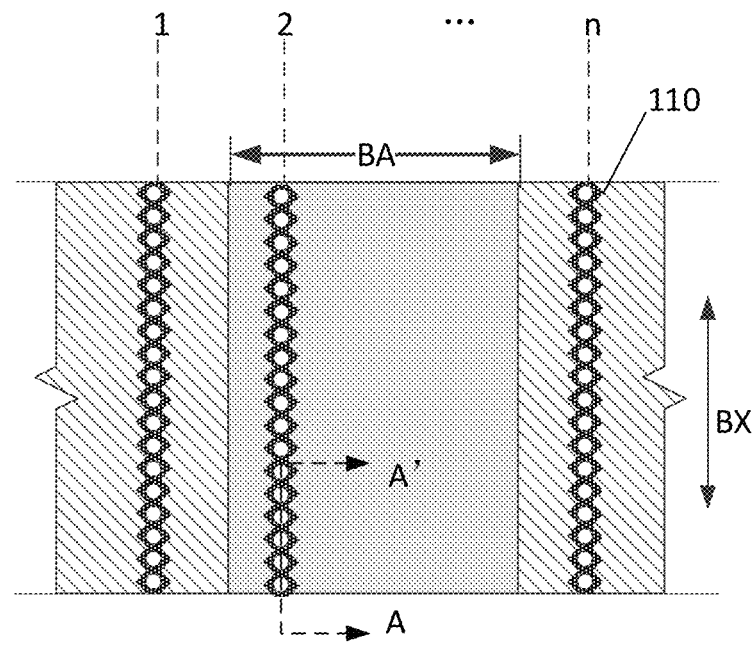
Figure 3L:
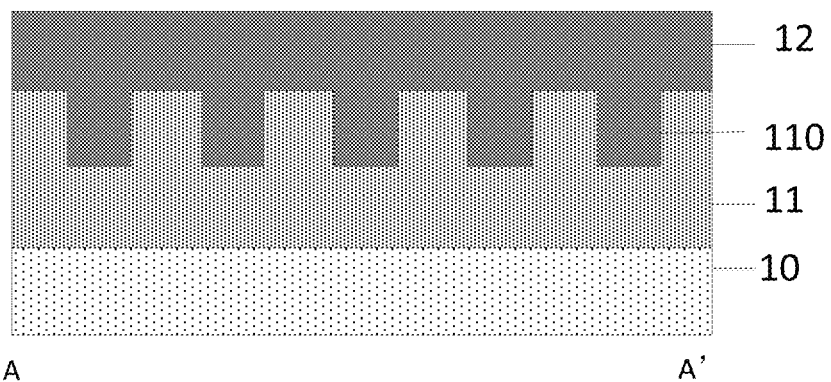
Figure 3M:
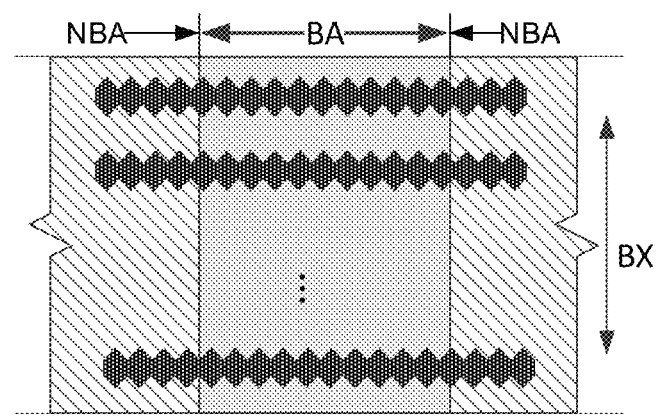
Figure 3N:
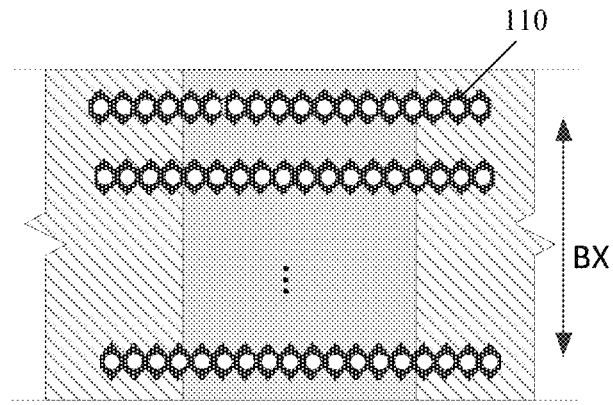
Figure 3O:
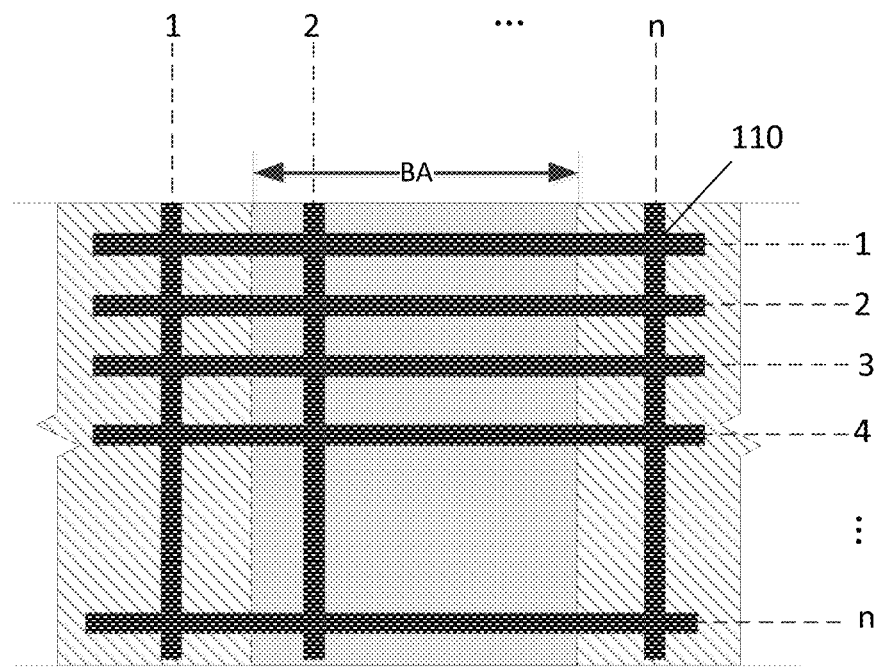
Figure 3P:
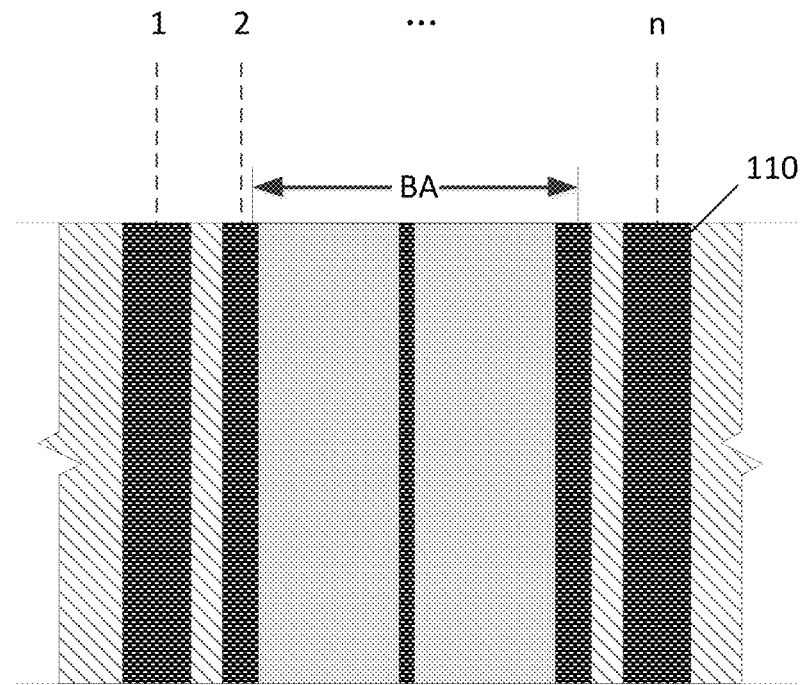
Figure 3Q:
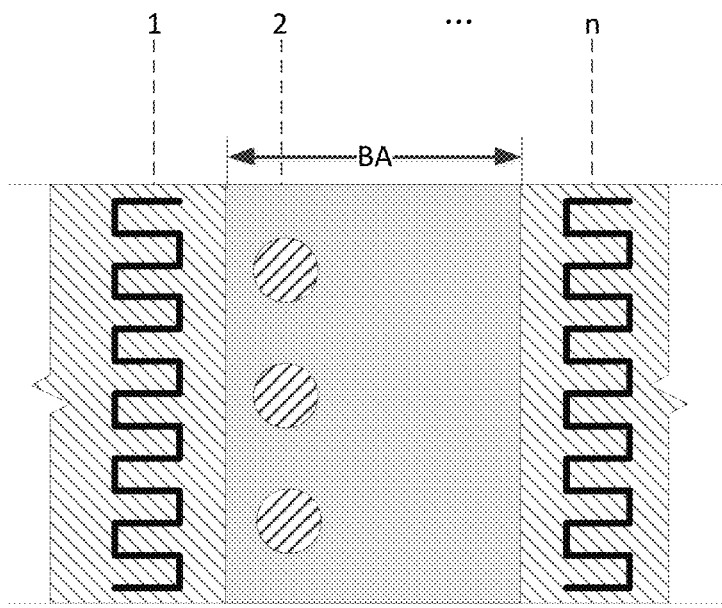
Figure 3R:
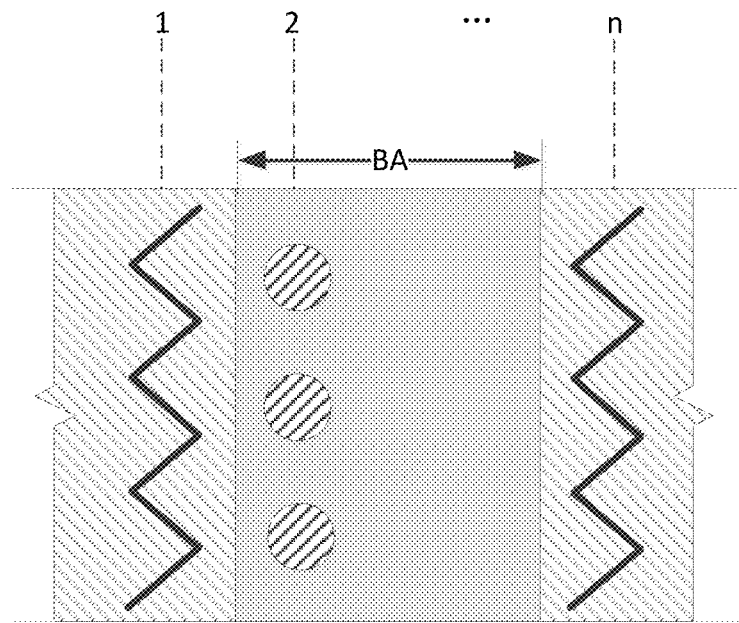

FIGS. 3A-3R illustrate several examples of the concave-convex structure of the flexible substrate provided by the embodiments of the present disclosure.

For example, as shown in FIG. 2, the concave structure 110 does not penetrate through the first organic layer 11. For example, in a direction perpendicular to the base substrate 10, an average size d1 of the concave structure 110 is a quarter to a half of an average size d2 of the first organic layer 11 in the bending region BA (i.e. a thickness that the first organic layer has at the flat portion).

For example, the concave structure may be a through-hole structure penetrating through the first organic layer 11, that is, d1=d2. In this case, the second organic layer 12 fills the through-hole structure.

For example, in order to improve the protection effect of the second organic layer 12 on the bending region BA, a coverage of the second organic layer 12 may be also extended beyond the bending region, that is, the second organic layer 12 also includes a portion which is in a non-bending region NBA located outside the bending region. In this case, as shown in FIGS. 3D-3I (plan views), in the non-bending region NBA, the surface where the first organic layer 11 and the second organic layer 12 are in contact with each other is also provided with the concave-convex structure 110.

For example, a cross-sectional shape of the concave structure 110 in the direction perpendicular to the base substrate 10 includes a rectangle, a regular trapezoid (as shown in FIG. 3A), an inverted trapezoid (as shown in FIG. 2), a semicircle, or an oval (as shown in FIG. 3B), or their combination (as shown in FIG. 3C).

For example, a planar shape of the concave structure 110 in a direction parallel to the base substrate 10 includes a circle (as shown in FIG. 3D), a triangle, a rectangle, an oval, a T-shape (as shown in FIG. 3F), a strip shape (as shown in FIGS. 3G-3N), a polyline shape (as shown in FIGS. 3I and 3J), a mesh shape (as shown in FIG. 3O), or combinations of the above (as shown in FIGS. 3H, 3K, 3M and 3N).

For example, the first organic layer 11 is formed by stacking a plurality of layer structures, and the concave-convex structure is formed by combining the concave-convex structures of the plurality of layer structures. For example, in FIG. 3C, the concave structure 110 is formed of two rectangular concave substructures, and the two concave substructures may be respectively disposed in two layer structures included in the first organic layer 11.

For example, as shown in FIGS. 3D, 3E and 3F, the concave-convex structure includes a plurality of concave structures 110, and the plurality of concave structures 110 are arranged in a dot-like periodic arrangement or staggered arrangement. For example, the plurality of concave structures 110 are arranged in n rows (n>1), and an extension direction of each row is parallel to a bending axis BX of the bending region BA, so that the bending resistance of the second organic layer 12 can be further improved, and the chance of falling off of the second organic layer 12 can be further reduced. For example, intervals between adjacent concave structures 110 are the same.

For example, as shown in FIGS. 3G and 3P, the concave-convex structure includes a plurality of concave structures 110, and each concave structure 110 is in a strip shape. For example, the planar shape of the strip-shaped concave structure 110 is a rectangle.

For example, as shown in FIG. 3H and FIG. 3M, an edge of the rectangle may further have a protruding pattern, and a shape of the pattern may be, for example, a circle or a polygon.

For example, as shown in FIGS. 3I and 3J, the planar shape of the strip-shaped concave structure 110 is a polyline.

For example, a plurality of kinds of patterns may also be combined to form the concave structure to further increase the adhesion force of the second organic layer 12 to the first organic layer 11. Please refer to FIGS. 3K and 3L together. FIG. 3L is a cross-sectional view of the flexible substrate in FIG. 3K taken along a direction of a section line A-A'. Dark patterns in the concave structures 110 are recessed into the first organic layer 11 with respect to light-colored patterns (circles), and the light-colored patterns may represent the reference plane of the first organic layer 11. In this case, the second organic layer 12 may be filled into the concave structures 110 and surround island portions (circle portions) of the first organic layer.

For example, as shown in FIGS. 3G-3K, the extension direction of the concave structure 110 is parallel to the bending axis BX of the bending region BA, so that the bending resistance of the second organic layer 12 can be improved.

For example, the extension direction of the concave structure 110 may also be perpendicular to the bending axis BX. As shown in FIGS. 3M and 3N, in the case that the coverage of the second organic layer (not shown) exceeds the bending region BA, the concave structure 110 is extended across the bending region BA to the non-bending regions NBA on two sides of the bending region BA, so as to be in contact with the portion of the second organic layer in the non-bending region NBA.

For example, as shown in FIG. 3O, the concave-convex structure includes a plurality of concave structures, each concave structure is strip-shaped, and the plurality of concave structures are intersected to form a mesh structure.

Because the second organic layer 12 is more likely to fall off at an edge position than at a central position, the concave-convex structure can be set to have a higher distribution density, a larger planar area or a larger cross section area at a position corresponding to the edge of the second organic layer 12 than at a position corresponding to the center of the second organic layer 12. With this arrangement, the contact area between the second organic layer 12 and the first organic layer 11 at the edge position can be increased to better release the bending stress and reduce the risk that the second organic layer 12 falls off at the edge position.

For example, as shown in FIG. 3P, the planar shape of the concave structure 110 is a strip, and the extension direction of the strip is parallel to the bending axis BX. A width of the strip gradually decreases from the position corresponding to the edge of the second organic layer 12 to the position corresponding to the center of the second organic layer 12. That is, the planar area of the concave structure gradually decreases from the edge of the second organic layer 12 to the center of the second organic layer 12.

For example, in FIG. 3O, the distribution density of the mesh concave-convex structures gradually decreases from the position corresponding to the edge of the second organic layer 12 to the position corresponding to the center of the second organic layer 12.

For example, as shown in FIGS. 3Q and 3R, the concave structures may have different shapes in the bending region BA and the non-bending region NBA.

It should be noted that, in the above plan view, in a case where there is no special description, the concave structure 110 may include a structure that is recessed with respect to the reference plane of the first organic layer 11; and the concave structure 110 may also include a structure that is raised with respect to the reference plane, or include the combination pattern of the structure that is recessed and the structure that is raised, which is not limited in the embodiments of the present disclosure.

For example, the base substrate 10 is an organic flexible material, such as polyimide (PI), polyethylene terephthalate (PET), polycarbonate, polyethylene, polyacrylate, polyetherimide, polyethersulfone, or the like.

For example, the material of the first organic layer 11 is at least one selected from the group consisting of polymethyl methacrylate, polycarbonate, polystyrene, epoxy resin, polyimide and polyethylene.

For example, the second organic layer 12 is an ultraviolet (UV)-curable material). For example, the second organic layer 12 may also be a heat-curable material. Alternatively, the material of the second organic layer 12 may include both a UV-curable component and a heat-curable component.

For example, the material of the second organic layer 12 is an ultraviolet curable adhesive (UV adhesive), a urethane acrylate (polyurethane acrylate), an epoxy acrylate, a polyester acrylate, or a polyether acrylate, or the like.

Figure 4:
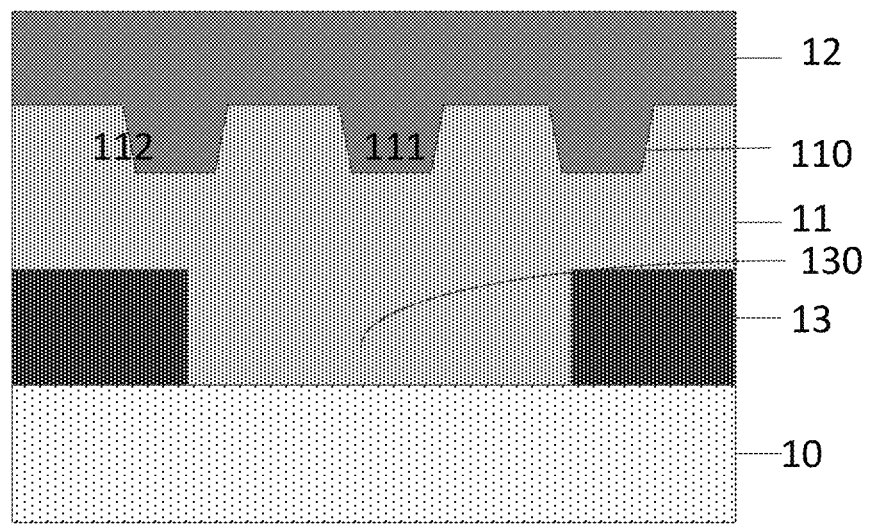
FIG. 4 is a schematic structural view of the flexible substrate according to another embodiment of the present disclosure.

For example, as shown in FIG. 4, the flexible substrate 100 further includes an insulating layer 13 provided between the base substrate 10 and the first organic layer 11. The insulating layer 13 is provided with an opening 130 corresponding to the bending region BA, and the first organic layer is covered on the insulating layer 13 and is filled the opening 130.

For example, the insulating layer 13 is an inorganic insulating material; for example, the inorganic insulating material is oxides of silicon, nitrides of silicon or oxynitrides of silicon such as silicon oxide, silicon nitride, silicon oxynitride, or is an insulating material including a metal element such as aluminum oxide, titanium nitride and the like.

Because the inorganic insulating material is generally poor in flexibility and easy to crack under an external force, the opening 130 is formed in the bending region to remove the inorganic insulating material, which can improve the bending resistance of the flexible substrate in the bending region.

As shown in the figure, the concave-convex structure includes a first portion 111 which is overlapped with the opening 130 and a second portion 112 which is overlapped with the opening 130.

For example, the insulating layer 13 may be a single-layer structure or a multi-layer structure including a plurality of insulating material layers, which is not limited to the embodiments of the present disclosure.

As described above, the flexible substrate is used in, for example, a display panel such as an organic light-emitting diode display panel or a liquid crystal display panel.

For example, the bending region BA is located in the non-display region of the display panel to realize a narrow-bezel display panel. For example, the bending region BA may be located in the display region of the display panel for achieving beautiful appearance, convenient holding or the like. The embodiments of the present disclosure do not limit the setting position of the bending region BA in the flexible substrate.

Figure 5:
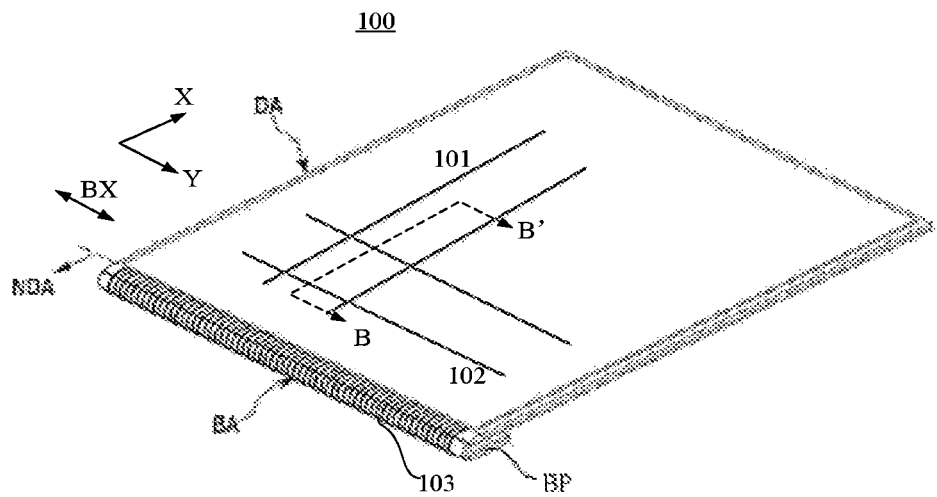
FIG. 5 is a schematic view of the flexible substrate serving as a display panel according to the embodiments of the present disclosure.

FIG. 5 is a schematic view of the flexible substrate serving as a display panel provided by the embodiments of the present disclosure. As shown in the figure, the bending region BA is disposed between a display region (DA) and a bonding region BP of the flexible substrate 100. The bonding region BP and the bending region BA are both located in a non-display region (NDA) outside the display region.

The display region DA is provided with a pixel array structure. The pixel array structure includes a plurality of gate lines 101 extended in an X direction and a plurality of data lines 102 extended in a Y direction, and the plurality of gate lines 101 and the plurality of data lines 102 are intersected with each other to define a plurality of pixel regions. For clarity, only a few gate lines and a few data lines are schematically drawn in FIG. 5 as a reference. The pixel array structure may further include a power line, a sensing line, and the like as needed.

A pad electrode (bonding pad, which is not shown) is provided in the bonding region BP, and is used to be bonded with external components (such as a driving chip), to provide various signals such as a power supply voltage signal, a timing signal and the like for the pixel array structure of the display region. The pixel array structure in the display region is connected to the pad electrode through a wire 103 to realize signal transmission between the pixel array structure and the pad electrode, and the wire 103 is extended across the bending region BA to connect the pad electrode and the pixel array structure.

For example, to facilitate wiring, the bending region BA is disposed at a non-display region side of the flexible substrate in the X direction, that is, a side along the extension direction of the data line 102, and the bending axis BX is parallel to the Y direction. In this way, a gate driving circuit can be bounded and arranged at the non-display region side of the array substrate along the Y direction, or a GOA (Gate Driver On Array) type gate driving circuit can be directly formed on the base substrate. The bending region may also be disposed in the non-display region of the flexible substrate in the extension direction of the gate line 101 (i.e., the X direction), and the bending axis is parallel to the extension direction of the data line 102 (i.e., the Y direction), which is not limited to the embodiments of the present disclosure.

In the following, taking the array substrate being an array substrate used in an OLED display panel as an example, and the structure of the array substrate provided by the embodiments of the present disclosure is exemplarily described with reference to FIGS. 6A-6C.

Figure 6A:
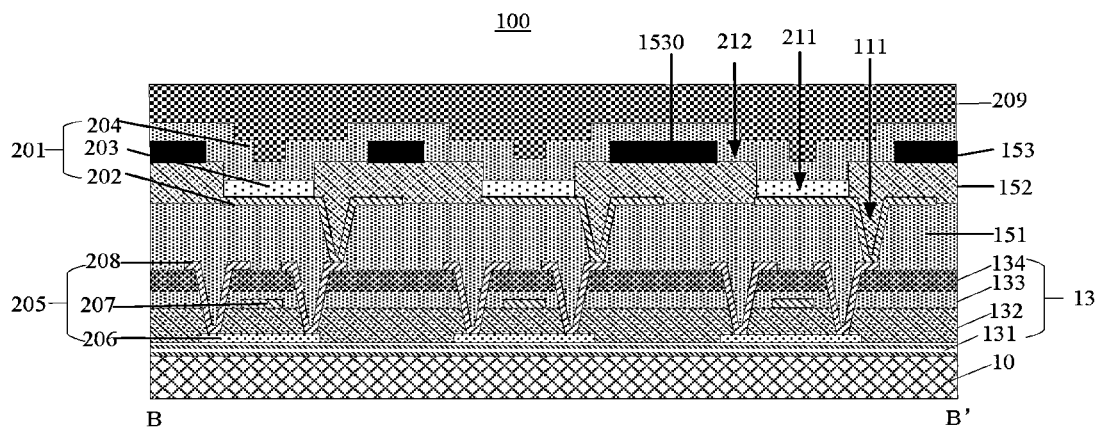
FIG. 6A is a partially enlarged cross-sectional view of a display region of the flexible substrate provided by the embodiments of the present disclosure.

FIG. 6A is an enlarged cross-sectional view of the display region of the flexible substrate taken along a B-B' direction according to the embodiments of the present disclosure. As shown in FIG. 6A, in the display region, the flexible substrate includes a pixel array structure disposed on the base substrate 10, the pixel array structure includes a plurality of organic light-emitting diodes (OLEDs) 201 and a pixel circuit connected to the plurality of the organic light-emitting diodes 201, and the organic light-emitting diode emits light under driving of the pixel circuit. For example, the pixel circuit includes a conventional OLED pixel driving circuit, for example, the pixel circuit includes a switching transistor, a driving transistor, a storage capacitor and the like, or may further include a reset transistor, a light emission control transistor and the like, and the embodiments of the present disclosure do not limit the specific structure of the pixel circuit. FIG. 6A shows three organic light-emitting diodes 201 arranged next to each other, and, for clarity, only the driving transistor 205 connected to the OLED in the pixel circuit is shown.

As shown in the figure, the driving transistor 205 includes an active layer 206, a gate electrode 207, a gate insulating layer 132, and a source-drain electrode layer 208 (including a source electrode and a drain electrode). The organic light-emitting diode 201 includes a first electrode 202, a second electrode 204, and an organic light-emitting layer 203 disposed between the first electrode 202 and the second electrode 204. The first electrode 202 is electrically connected to the drain electrode of the driving transistor 205.

It should be noted that the source electrode and the drain electrode of the transistor used here can be symmetrical in structure, so the source electrode and the drain electrode of the transistor can be indistinguishable in structure, and thus the source electrode and the drain electrode can be interchanged as required. In FIG. 6A, the driving transistor 205 is of a top-gate type, but the embodiments of the present disclosure do not limit a specific type of the transistor. In addition to being of the top-gate type, it may also be of a bottom-gate type or a double-gate type. And, in a case where the transistor is of a type different from the top-gate type, the layer structure on the base substrate is adjusted accordingly and different from that of the top-gate type transistor.

The flexible substrate includes a planarization layer 151 disposed between the source-drain electrode layer 208 and the first electrode 202, a pixel defining layer (PDL) 152, and a spacer layer 153 which are disposed on the first electrode 202.

A via hole 111 is provided in the planarization layer 151, and the first electrode 202 is electrically connected to the drain electrode of the driving transistor 205 through the via hole 111.

The pixel defining layer 152 is used to space adjacent organic light-emitting layers 203 apart from each other so as to avoid cross color. A first opening 211 is provided in the pixel defining layer 152 to define a pixel region (opening region), the first opening exposes the first electrode 202 of the organic light-emitting element 201, and the organic light-emitting layer 203 is formed on the first electrode 202 through the first opening.

The spacer layer 153 is used to support an evaporation mask when the organic light-emitting layer 203 is formed by evaporation, so as to isolate the pixel defining layer 152 from the evaporation mask to protect the pixel defining layer 152. The spacer layer 153 also can play a role of further isolating adjacent organic light-emitting layers. The spacer layer 153 generally includes a plurality of spacers 1530 separated by second openings 212. A shape of the spacers 1530 is generally cuboid, columnar, spherical, hemispherical, or is not limited thereto.

The materials of the planarization layer 151, the pixel defining layer 152 and the spacer layer 153 are organic materials, which is, for example, at least one selected from the group consisting of polymethyl methacrylate, polycarbonate, polystyrene, epoxy resin, polyimide, and polyethylene.

For example, the flexible substrate further includes an encapsulation layer 209 that seals the OLED 201, so that the degradation of the OLED 201 caused by moisture and/or oxygen included in the environment can be reduced or prevented.

For example, the flexible substrate further includes a buffer layer 131 disposed between the base substrate 10 and the active layer 206. The buffer layer is used to provide a flat surface for the forming of the pixel array structure, and a material of the buffer layer is, for example, silicon nitride, silicon oxide, or nitrogen oxides of silicon. The buffer layer can also play a role of preventing the moisture and/or oxygen from penetrating through the base substrate 10, thereby protecting the pixel array structure. The buffer layer may include, for example, a multi-layer structure, and may be formed of a plurality of layers in which silicon oxide and silicon nitride are alternately laminated, for example.

Figure 6B:
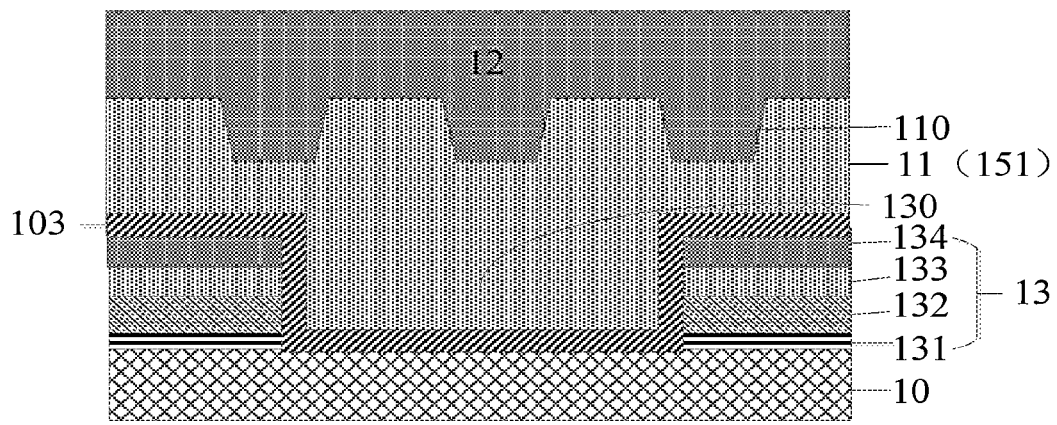
FIGS. 6B-6C are enlarged cross-sectional views of the bending region of the flexible substrate according to the embodiments of the present disclosure.
Figure 6C:
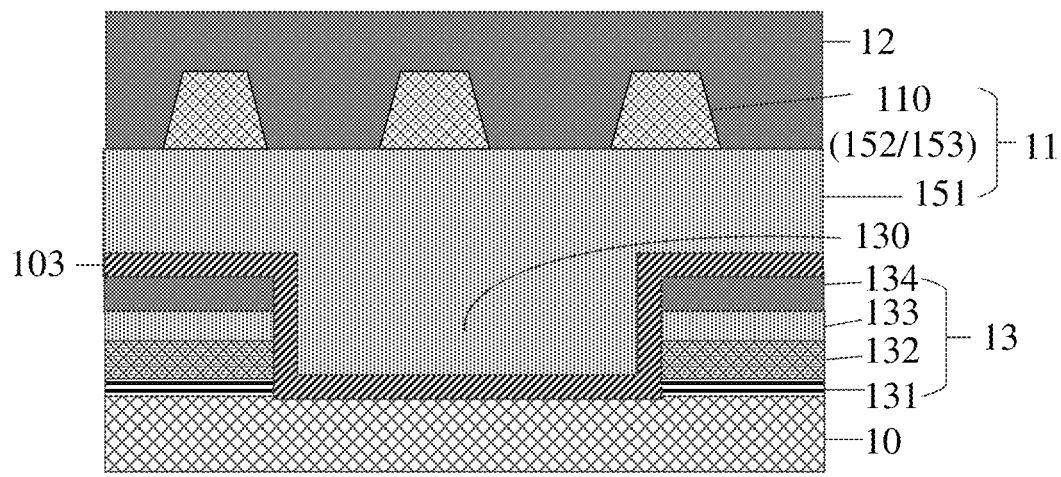

Please refer to FIG. 6B, which is an enlarged cross-sectional view of the flexible substrate in the bending region BA. In the bending region, the flexible substrate includes the buffer layer 131, the gate insulating layer 132, a first interlayer insulating layer 133, a second interlayer insulating layer 134, the wire 103, the first organic layer 11 and the second organic layer 12 which are sequentially disposed on the base substrate 10.

As shown in the figure, the buffer layer 131, the gate insulating layer 132, the first interlayer insulating layer 133 and the second interlayer insulating layer 134 cooperatively form the insulating layer 13; that is, the insulating layer 13 includes a plurality of insulating structural layers. The opening 130 is provided in the insulating layer 13. For example, the wire 103 is filled in and extended through the opening. For example, the wire 103 and the source-drain electrode layer 208 of the driving transistor 205 are disposed in the same layer, and can be formed by patterning a same conductive material layer through a same patterning process.

As shown in the figure, the first organic layer 11 includes the planarization layer 151, and the concave structure 110 is disposed in a surface of the planarization layer 151.

In another example, the first organic layer 11 further includes the pixel defining layer 152 and/or the spacer layer 153 disposed on the planarization layer 151. For example, as shown in FIG. 6C, in the bending region BA, the pixel defining layer 152 and/or the spacer layer 153 include/ includes a plurality of portions (i.e., the concave structures 110) spaced apart from each other, and the plurality of portions form the concave-convex structure; That is, the concave structure 110 is formed by one of the pixel defining layer 152 and the spacer layer 153; or, the concave structure 110 is formed by both the pixel defining layer 152 and the spacer layer 153, which can be referred to the example of FIG. 3C, and is not repeated herein.

In this case, the second organic layer 12 is filled in spacing regions in the pixel defining layer 152 and/or the spacer layer 153 and is in contact with the surface of the planarization layer 151.

Patterns of the planarization layer 151 in the bending region and in the display region can be simultaneously formed in one patterning process. For example, in the case where the concave structure 110 is in the surface of the planarization layer 151 (as shown in FIG. 6B), the via hole 111 and the concave structure in the planarization layer 151 may be formed in one patterning process. For example, in a case where a height of the concave structure 110 is different from a height of the via hole 111 (that is, a thickness of the planarization layer 151), the via hole and the concave structure may be formed in one patterning process by using a halftone mask.

For example, in a case where the first organic layer further includes the pixel defining layer 152, that is, the concave structure 110 is formed by the pixel defining layer 152; in this situation, the first opening 211 and the concave structure 110 in the pixel defining layer can be formed in one patterning process. For example, in the one patterning process, openings are simultaneously formed in both a portion of the pixel defining layer 152 in the display region and a portion of the pixel defining layer 152 in the bending region. The openings in the display region are the first openings 211 described above, and the openings in the bending region divide the pixel defining layer 152 into a plurality of portions to form the concave structures.

The above description is also applicable to the spacer layer 153. For example, in one patterning process, openings can be simultaneously formed in both a portion of the spacer layer 153 in the display region and a portion of the spacer layer 153 in the bending region. The openings in the display region separate the spacer layer 153 into the plurality of spacers 1530, and the openings in the bending region separate the spacer layer 152 into a plurality of portions to form the concave structures. Detailed descriptions are omitted herein.

For example, the coverage of the second organic layer 12 may also be extended to the non-display region outside the bending region. In this case, in the non-bending region covered by the second organic layer 12, the surface where the first organic layer 11 contacts the second organic layer 12 may be also provided with the concave-convex structure 110.

Figure 7:
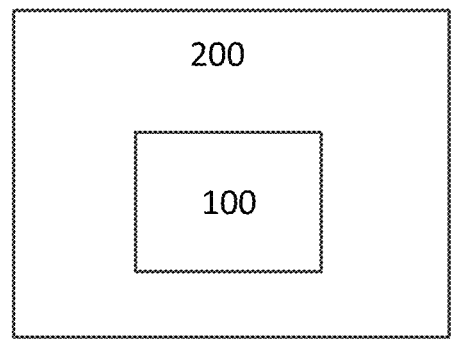
FIG. 7 is a schematic diagram of a display device provided by the embodiments of the present disclosure.

The embodiments of the present disclosure further provide a display device. As shown in FIG. 7, the display device 200 includes the flexible substrate 100 described above.

For example, the display device 200 is an organic light-emitting diode display device, a liquid crystal display device, an electronic paper display device, or the like.

Figure 8:
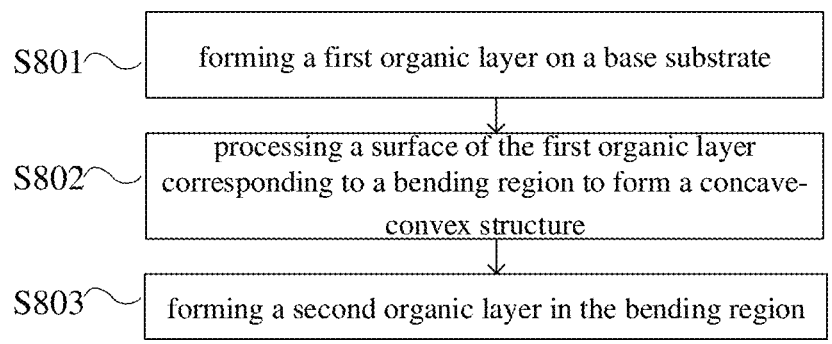
FIG. 8 is a flowchart of a manufacturing method of the flexible substrate according to the embodiments of the present disclosure.

The embodiments of the present disclosure also provide a manufacturing method of a flexible substrate, and the manufacturing method is used for manufacturing the above-mentioned flexible substrate. As shown in FIG. 8, the manufacturing method includes:

Step S801: forming the first organic layer on the base substrate;

Step S802: processing the surface of the first organic layer in (corresponding to) the bending region to form the concave-convex structure; and Step S803: forming the second organic layer in the bending region.

For example, the forming the second organic layer includes: forming an organic solution layer on the first organic layer, and curing the organic solution layer to form the second organic layer.

For example, the organic solution layer is formed on the first organic layer by printing or spin coating.

Because the organic solution layer is liquid or semi-solid, it can be filled into the concave-convex structure in the first organic layer naturally to form a flat surface. Therefore, the solid second organic layer formed after curing has a flat surface.

For example, a method of the curing may be UV curing or thermal curing, or may use both UV curing and thermal curing, according to the material components of the organic solution layer.

For example, the material of the organic solution layer is ultraviolet curing glue (UV glue), urethane acrylate (polyurethane acrylate), epoxy acrylate, polyester acrylate or polyether acrylate.

For example, the processing the surface of the first organic layer in (corresponding to) the bending region includes: performing a conventional photolithography step on the first organic layer to form the concave-convex structure in the surface of the first organic layer.

Thereafter, the bending region of the flexible substrate is bent, and the edge portion of the flexible substrate outside the bending region is folded to the back of the main body portion of the flexible substrate, so that a width of a peripheral portion of the display panel can be reduced, and a narrow-bezel display panel can be realized.

What are described above is related to the illustrative embodiments of the disclosure only and not limitative to the scope of the disclosure; the scopes of the disclosure are defined by the accompanying claims.

What is claimed is:

1. A flexible substrate, comprising a display region and a bending region outside the display region, wherein the flexible substrate comprises a base substrate and a first organic layer and a second organic layer which are sequentially laminated on the base substrate;
   the flexible substrate is a display substrate and comprises a pixel array in the display region and on the base substrate, and the first organic layer comprises a pixel defining layer and a spacer layer on a side of the pixel defining layer away from the base substrate;
   the spacer layer comprises a plurality of first portions spaced apart from each other to form a concave-convex structure in the bending region, and the concave-convex structure is at a surface of the first organic layer where the first organic layer contacts the second organic layer.

2. The flexible substrate according to claim 1, wherein the concave-convex structure comprises at least one concave structure, and
   the second organic layer comprises a first portion filled into the at least one concave structure and a second portion outside the at least one concave structure.

3. The flexible substrate according to claim 2, wherein the concave-convex structure has a higher distribution density, a larger planar area, or a larger cross section area at a position corresponding to an edge of the second organic layer than at a position corresponding to a center of the second organic layer.

4. The flexible substrate according to claim 2, wherein the concave-convex structure comprises a plurality of concave structures;
   the plurality of concave structures are arranged in a plurality of rows, and an extension direction of each of the plurality of rows is parallel to a bending axis of the bending region.

5. The flexible substrate according to claim 4, wherein a planar shape of each of the plurality of concave structures is a strip, an extension direction of the strip is parallel to the bending axis, and a width of the strip gradually decreases from a position corresponding to an edge of the second organic layer to a position corresponding to a center of the second organic layer.

6. The flexible substrate according to claim 2, wherein the concave-convex structure comprises a plurality of concave structures, each of the plurality of concave structures is strip-shaped, and the plurality of concave structures are intersected to form a mesh structure.

7. The flexible substrate according to claim 2, wherein a cross-sectional shape of the concave structure in a direction perpendicular to the base substrate comprises at least one selected from the group consisting of a rectangle, a trapezoid, a semicircle and an oval;
   a planar shape of the concave structure in a direction parallel to the base substrate comprises at least one selected from the group consisting of a circle, a triangle, a rectangle, an oval, a T-shape, a strip shape, a polyline shape and a mesh shape.

8. The flexible substrate according to claim 1, wherein the flexible substrate further comprises an insulating layer between the base substrate and the first organic layer, and the insulating layer comprises an opening in the bending region for bending, and the first organic layer is covered on the insulating layer and filled in the opening.

9. The flexible substrate according to claim 1, wherein the second organic layer is extended outside the bending region, and the concave-convex structure is further provided at a surface of the first organic layer where the first organic layer contacts the second organic layer outside the bending region.

10. The flexible substrate according to claim 1, wherein pixel defining layer comprises a plurality of second portions spaced apart from each other and the plurality of first portions are respectively on the plurality of second portions in one-to-one correspondence, thereby the concave-convex structure being formed by both the pixel defining layer and the spacer layer.

11. The flexible substrate according to claim 10, further comprising a planarization layer on a side of the pixel defining layer close to the base substrate,
wherein the pixel array comprises a pixel electrode layer between the planarization layer and the pixel defining layer in the display region.

12. The flexible substrate according to claim 11, wherein the second organic layer is filled into a concave region of the concave-convex structure of the first organic layer, and is in contact with a surface of the planarization layer.

13. The flexible substrate according to claim 1, wherein the second organic layer is a UV-curable material.

14. The flexible substrate according to claim 1, wherein a material of the first organic layer is at least one selected from the group consisting of polymethyl methacrylate, polycarbonate, polystyrene, epoxy resin, polyimide and polyethylene.

15. The flexible substrate according to claim 1, further comprising a bonding region outside the display region, wherein the bending region is between the display region and the bonding region.

16. A display device, comprising the flexible substrate according to claim 1.

17. A manufacturing method of the flexible substrate according to claim 1, comprising:
forming the first organic layer on the base substrate, and processing the surface of the first organic layer in the bending region to form the concave-convex structure, and
forming the second organic layer in the bending region.

18. The manufacturing method according to claim 17, wherein the forming the second organic layer comprises:
forming an organic solution layer on the first organic layer, and curing the organic solution layer to form the second organic layer.

19. The flexible substrate according to claim 1, wherein the spacer layer further comprises a plurality of spacers spaced apart from each other in the display region to space apart adjacent pixels of the pixel array.

20. The flexible substrate according to claim 1, wherein the concave-convex structure comprises a plurality of concave structures;
each of the plurality of concave structures is arranged in a strip extended along a bending axis of the bending region;
a width of the strip gradually increases from a center of the bending region to an edge of the bending region.

* * * * *